(12) United States Patent
Zhang et al.

(10) Patent No.: US 12,690,174 B2
(45) Date of Patent: Jul. 21, 2026

(54) SERVER SYSTEM THERMAL CONTROL BASED ON POWER CONSUMPTION

(71) Applicant: Google LLC, Mountain View, CA (US)

(72) Inventors: Feini Zhang, Sunnyvale, CA (US); Arthur Joachim Korn, Mountain View, CA (US); Joshua Michael Lehan, Castro Valley, CA (US)

(73) Assignee: Google LLC, Mountain View, CA (US)

( * ) Notice: Subject to any disclaimer, the term of this patent is extended or adjusted under 35 U.S.C. 154(b) by 376 days.

(21) Appl. No.: 18/237,126

(22) Filed: Aug. 23, 2023

(65) Prior Publication Data

US 2025/0071952 A1 Feb. 27, 2025

(51) Int. Cl.
*H05K 7/20* (2006.01)
*G06F 1/20* (2006.01)

(52) U.S. Cl.
CPC ......... *H05K 7/20836* (2013.01); *G06F 1/206* (2013.01); *H05K 7/20718* (2013.01)

(58) Field of Classification Search
CPC ......... G06F 1/206; G06F 1/28; G06F 1/3206; G06F 1/3287; H05K 7/20718; H05K 7/20745; H05K 7/20836; H10K 2102/103; H10K 50/15; H10K 50/17; H10K 50/805; H10K 59/12; H10K 59/1201; H10K 59/1213; H10K 59/122; H10K 59/124; H10K 59/131; H10K 59/1315; H10K 59/805; H10K 59/8051; H10K 59/8052; H10K 59/873; H10K 71/00; H10K 71/60; H10K 71/621; H10K 77/10

USPC .......................................................... 700/300
See application file for complete search history.

(56) References Cited

U.S. PATENT DOCUMENTS

| | | | |
|---|---|---|---|
| 6,445,580 B1 | 9/2002 | Cohen et al. | |
| 7,451,332 B2 | 11/2008 | Culbert et al. | |
| 7,865,750 B2 | 1/2011 | Singh et al. | |
| 8,387,890 B2 | 3/2013 | Crocker et al. | |
| 10,222,843 B1* | 3/2019 | Lin ................... | H05K 7/20209 |
| 10,353,446 B2 | 7/2019 | Lovicott et al. | |
| 2008/0186670 A1 | 8/2008 | Lyon et al. | |
| 2009/0099792 A1* | 4/2009 | Riegler ................. | G06F 1/32 |
| | | | 702/45 |
| 2010/0023787 A1* | 1/2010 | Ho ........................ | G06F 1/3203 |
| | | | 713/320 |

(Continued)

OTHER PUBLICATIONS

Extended European Search Report for European Patent Application No. 24195722.4 dated Jan. 27, 2025. 15 pages.

(Continued)

*Primary Examiner* — Chun Cao
(74) *Attorney, Agent, or Firm* — Lerner David LLP

(57) ABSTRACT

Generally disclosed herein is a mechanism to manage the thermal control of servers equipped in a data center based on the measurements of the power consumption of each server and each thermally critical component in the server system. A controller may monitor the power consumption of one or more components or one or more servers and trigger responsive cooling action by one or more cooling fans based on changes in the power consumption. In this regard, the cooling fans are proactively activated prior to temperatures reaching high levels, thereby efficiently maintaining safe operating temperatures in the data center for the computing devices and/or for occupational safety.

14 Claims, 6 Drawing Sheets

(56)                    References Cited

U.S. PATENT DOCUMENTS

| | | | |
|---|---|---|---|
| 2011/0239025 A1* | 9/2011 | Artman .............. | H05K 7/20836<br>713/323 |
| 2012/0221872 A1* | 8/2012 | Artman .............. | H05K 7/20836<br>713/320 |
| 2013/0103210 A1 | 4/2013 | Brey et al. | |
| 2013/0332757 A1* | 12/2013 | Moss ...................... | G06F 1/206<br>713/320 |
| 2018/0004262 A1* | 1/2018 | Lovicott ................ | G06F 1/206 |
| 2018/0054918 A1 | 2/2018 | Wang | |
| 2018/0059747 A1 | 3/2018 | Pfeifer et al. | |
| 2019/0361508 A1 | 11/2019 | Yarragunta et al. | |

OTHER PUBLICATIONS

Tiian et al., "SpinSmart: Exploring Optimal Server Fan Speeds to Improve Overall System Energy Consumption," e-Energy'20, Jun. 22-26, 2020, Virtual Event, Australia pp. 474-481.
Best Practices Guide for Energy-Efficient Data Center Design Prepared by the National Renewable Energy Laboratory (NREL), a national laboratory of the U.S. Department of Energy, Office of Energy Efficiency and Renewable Energy revised Mar. 2011.

* cited by examiner

Computing Device — 200

Temperature Control System — 202

Memory — 204

Data — 206

Instructions — 208

Processor(s) — 210

Power Consumption Monitoring Module — 212

Thermal Exhaust Monitoring Module — 214

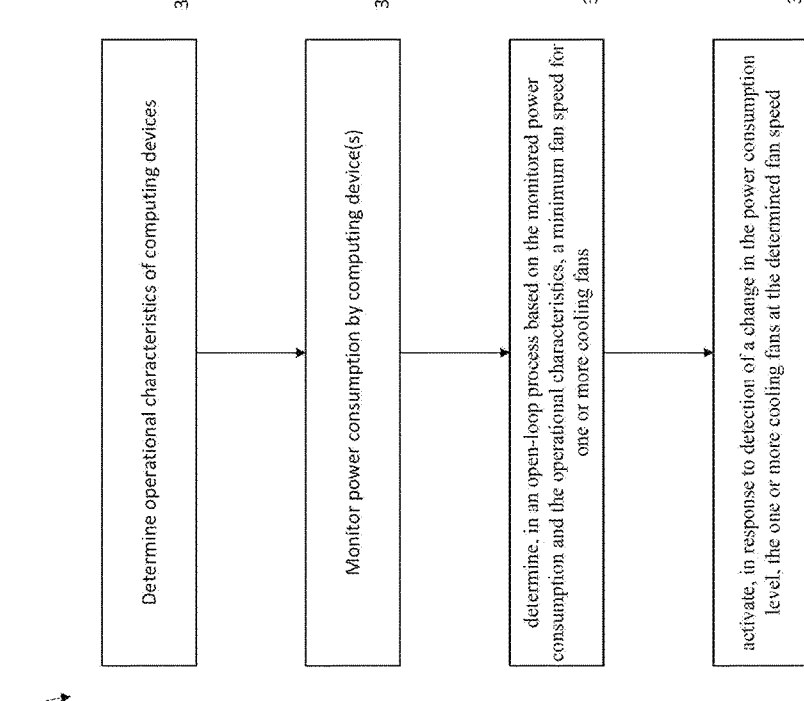

300

302

Determine operational characteristics of computing devices

304

Monitor power consumption by computing device(s)

306 determine, in an open-loop process based on the monitored power consumption and the operational characteristics, a minimum fan speed for one or more cooling fans

308 activate, in response to detection of a change in the power consumption level, the one or more cooling fans at the determined fan speed

FIG. 3

SERVER SYSTEM THERMAL CONTROL BASED ON POWER CONSUMPTION

BACKGROUND

Data centers house electronic components, such as servers and other computing and storage devices, which can be used for cloud computing or internet hosting. The electronic components generate heat when operating. If the components generate too much heat, they can experience failures. Conventionally, heat generated by the electronic hardware is managed by monitoring temperatures at different locations, and employing cooling techniques when the temperature reaches a threshold. Such cooling techniques may include fans that start or increase speed when the threshold temperature is reached. However, as the fans take time to cool the electronic components after the threshold temperature is reached, the electronic components can operate under higher temperature while the cooling process takes place, putting the electronic components at risk.

SUMMARY

Generally disclosed herein is a mechanism to manage the thermal control of servers or other computing devices in a data center based on the measurements of power consumption by the computing devices. A controller may monitor the level of power consumed by the computing devices and determine, based on spikes in the power consumed, whether to activate or accelerate cooling techniques. For example, the controller may compare the monitored power consumption level to historical data and/or test data. If the power consumption level exceeds a threshold, the controller may cause one or more fans equipped in the data center to operate proactively to begin a cooling process before temperatures rise to threshold levels. According to some examples, thermal exhaust temperatures are specified as an input for determining a minimum fan speed to be employed to maintain the thermal exhaust temperatures within safe operating levels. The minimum fan speed can be dynamically adjusted at a component level, system level, data center server rack level, etc.

An aspect of the disclosure provides a thermal control system for thermal control of a server system. The thermal control system includes memory and one or more processors in communication with the memory. The one or more processors may be configured to identify operational characteristics of a plurality of computing devices, monitor a power consumption level of the plurality of computing devices, determine, in an open-loop system based on the monitored power consumption level and the operational characteristics, minimum fan speed for one or more cooling fans, and activate, in response to detection of a change in the power consumption level, the one or more cooling fans at the minimum fan speed.

The power consumption level may be measured for an aggregate of the plurality of computing devices. The speed of each of the one or more cooling fans may be controlled uniformly based on the power consumption level measured for the aggregate of the plurality of computing devices. In some examples, the change in power consumption level may be compared to a threshold determined using test data. The speed of the one or more cooling fans may be configured to change in advance when the monitored power consumption level changes, while exhaust temperature does not exceed a preconfigured temperature limit.

Another aspect of the disclosure provides a method for thermal control of a data center, the method comprising identifying operational characteristics of a plurality of computing devices; monitoring, with one or more processors, a power consumption level of the plurality of computing devices; determining, based on the monitored power consumption level and the operational characteristics for the plurality of computing devices, a minimum fan speed for one or more cooling fans; and in response to detection of a change in the monitored power consumption level, activating the one or more cooling fans at the minimum fan speed.

According to some examples, the power consumption level may be measured for an aggregate of the plurality of computing devices. According to some examples, the speed of each of the one or more fans may be controlled uniformly based on the power consumption level measured for the aggregate of the plurality of computing devices. According to some examples, the change in power consumption level may be compared to a threshold determined using test data. According to some examples, the speed of the one or more cooling fans may be configured to change in advance when the monitored power consumption level exceeds a preconfigured power threshold, while exhaust temperature does not exceed a limit.

Yet another aspect of the disclosure provides a non-transitory machine-readable medium comprising machine-readable instructions encoded thereon for performing a method of thermal control of a data center. The method comprises identifying operational characteristics of a plurality of computing devices; monitoring a power consumption level of a plurality of computing devices; determining, in an open-loop system based on the monitored power consumption level and operational characteristics for the plurality of computing devices, a minimum fan speed for one or more cooling fans; and activating, in response to detection of a change in the power consumption level, the one or more cooling fans at the minimum fan speed.

According to some examples, the power consumption level may be measured for an aggregate of the plurality of computing devices. According to some examples, the speed of each of the one or more cooling fans may be controlled uniformly based on the power consumption level measured for the aggregate of the plurality of computing devices. According to some examples, the change in power consumption level may be compared to a threshold determined using test data.

BRIEF DESCRIPTION OF THE DRAWINGS

FIG. 3 is an example flow diagram for thermal control based on power consumption in accordance with aspects of the disclosure.

DETAILED DESCRIPTION

The present disclosure relates to methods and systems for controlling the temperature of a data center based on monitoring power consumption by computing devices within the data center. The power consumption level of each computing device may be measured and aggregated by a controller. The controller may determine, based on analysis of historical data, test data, etc., whether to activate or accelerate cooling fans based on the measured power consumption. For example, a machine learning model may be employed to predict how exhaust temperatures of the computing devices will likely increase based on trends in the monitored power consumption, and cause the cooling fans to activate, to maintain the exhaust temperature within predetermined limits. In some examples, the cooling fans may be activated based on power consumption reaching a predetermined threshold level. The predetermined threshold level may be determined using data correlating power consumption with temperature increase.

According to some examples, the thermal control system may monitor the thermal exhaust temperatures in the data center. The thermal exhaust temperatures may be used to determine a minimum speed for the fans to operate to achieve a desired level of cooling once triggered by the changes in measured power consumption. For example, the fans may operate at the minimum speed needed to maintain thermal exhaust temperatures within predefined limits.

According to some examples, the thermal control system may control the operation of the one or more fans equipped in the data center based on monitoring a single computing device's power consumption level. In other examples, the thermal control system may control the operation of the one or more fans based on the aggregate power consumption levels of multiple computing devices. If a particular data center has clusters of servers that historically have similar usage of power, single-device monitoring may be more feasible and advantageous to preserve energy and resources by monitoring a single computing device as opposed to monitoring sets of multiple computing devices.

Figure 1:
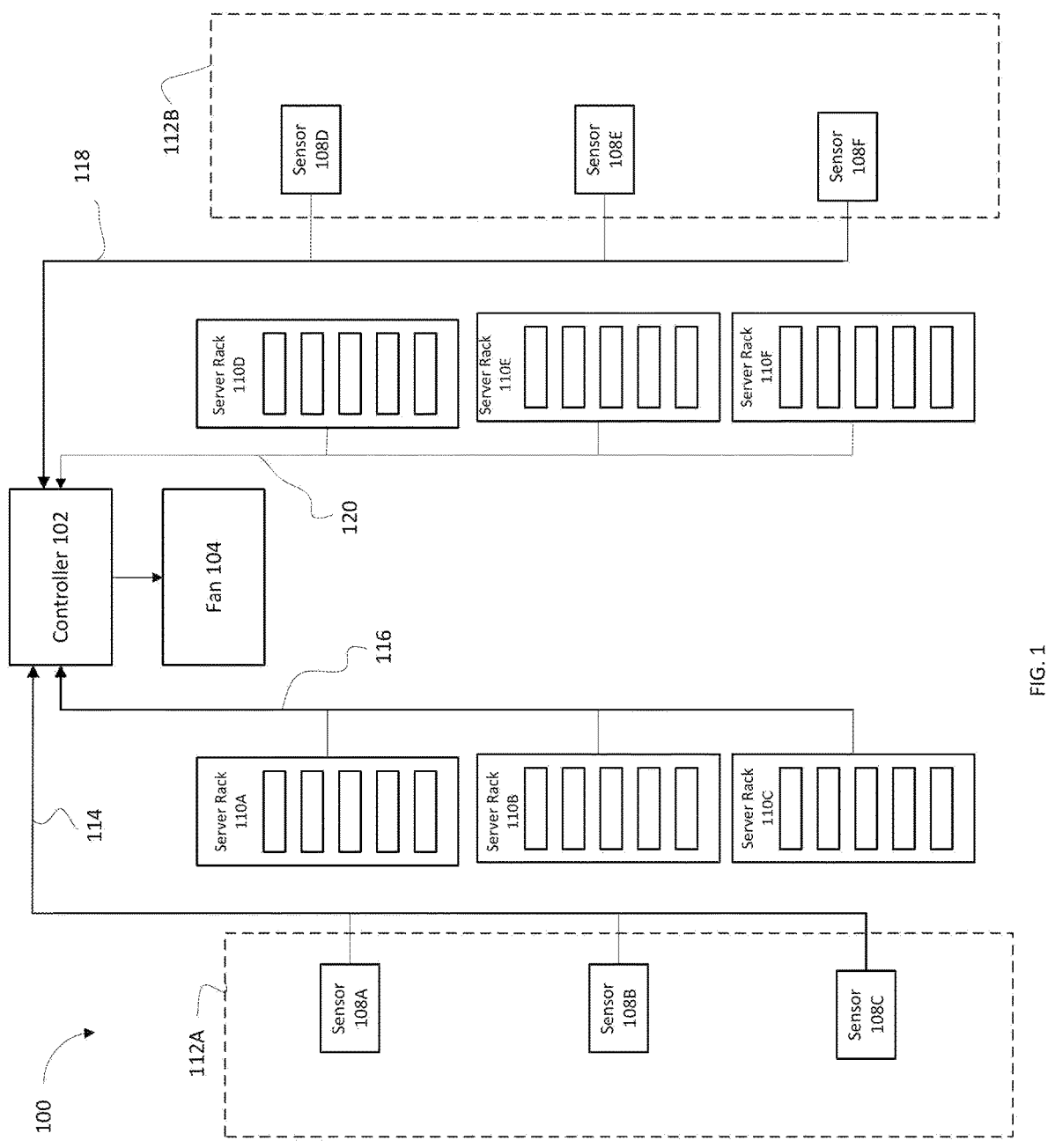
FIG. 1 is a schematic representation of a thermal control system for a data center in accordance with aspects of the disclosure.

FIG. 1 is a schematic representation of a thermal control system 100 for a data center. The thermal control system 100 includes controller 102 and fan 104, which may be positioned with respect to server racks 110A-F and thermal exhausts 112A-B. Thermal exhaust 112A includes sensors 108A-C and thermal exhaust 112B includes sensors 108D-F. Server racks 110A-F include one or more computing devices, such as for internet hosting, cloud computing, etc. Each computing device of each server rack includes processors that are comprised of individual circuits such as transistors. Each operation performed at a circuit may require at least a small amount of power, and thus, each operation of the circuit generates a certain amount of heat as a byproduct. Although each individual circuit may generate relatively little heat, each server rack may produce a fairly large amount of heat since each server rack may include multiple computing devices comprising multiple circuits and transistors.

Each server rack may send the measurement of power consumption in watts to controller 102 via bus 116. Bus 116 may include a physical layer implementing a communication protocol between a power consumption sensor attached to each server rack and controller 102. Server racks 110A-

110C may send the level of the power consumption via bus 116. Server racks 110D-F may send the same information via bus 120. Server racks 110A-C may be located on one side of the data center and server racks 110D-F may be located on another side of the data center such that fan 104 may be centrally located for optimal airflow among server racks.

Thermal exhaust 112A may monitor the temperature of server racks 110A-110C. For example, sensor 108A may measure the temperature of the exhaust of server rack 110A. Sensors 108A-C may monitor the exhaust temperatures and send the measurements to controller 102 via bus 114. Similarly, thermal exhaust 112B may include sensors 108D-F to measure the temperatures of the exhaust of each of server racks 110D-F and send the measurements to controller 102 via bus 118. Controller 102 may use the measured temperatures of thermal exhausts 112A-B to determine a minimum operating speed for fan 104. For example, controller 112A may receive the input of power consumption level in accordance with the measured power consumption level from server racks 110A-F and determine whether to start the operation of fan 104. Controller 112A may use the temperature information received from sensors 108A-F as additional input to determine minimal operating speed of fan 104 to keep the temperatures of the thermal exhausts 112A-B at the setpoint, thereby using a minimum amount of energy to prevent an abrupt increase of the temperature in data center 100. For example, for exhaust air temperature control, the power sensor may be employed when there is no exhaust air temperature sensor, or no way to measure average exhaust air temperature accurately.

Figure 2:
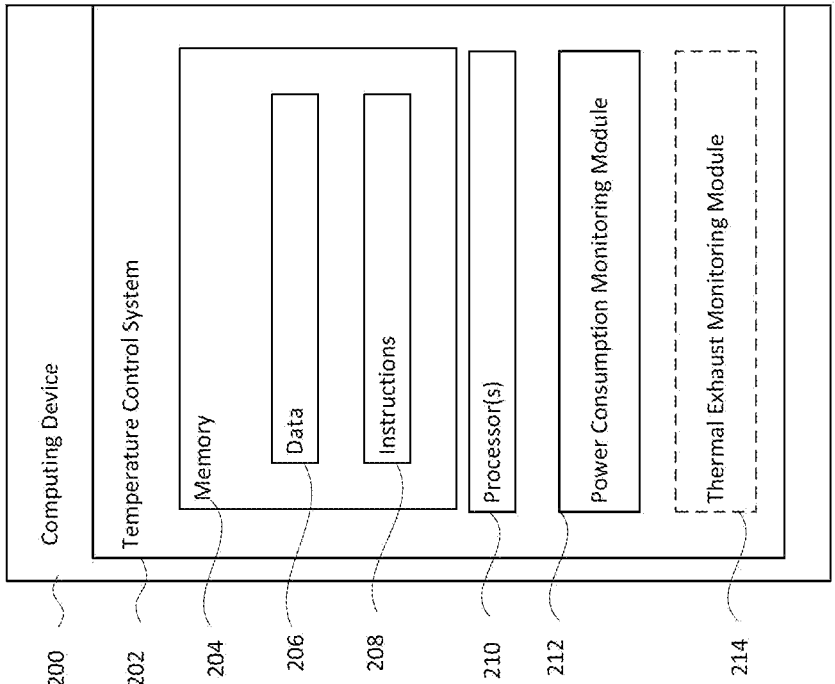
FIG. 2 is an example control system configured to control the temperature of the data center in accordance with aspects of the disclosure.

FIG. 2 is a block diagram illustrating an example computing device 200 according to aspects of this disclosure. The computing device can take on a variety of configurations, such as, for example, a controller or microcontroller, or a processor, such as a CPU, a GPU, or an ASIC, including a tensor processing unit (TPU). The computing device may further include the temperature control system 202. In some examples, as previously discussed, the temperature control system 202 may be configured to activate or accelerate the cooling fans based on the power consumption level of server racks 110A-F depicted in FIG. 1.

The temperature control system 202 may include a processor 210, memory 204 including data 206 and instructions 208, power consumption monitoring module 212, as well as other components typically present in server computing devices. In other examples, such operations may be performed by one or more of the computing devices in a data center or elsewhere.

The memory 204 can store information accessible by the processor 210, including instructions 208 that can be executed by the processor 210. Memory can also include data 206 that can be retrieved, manipulated, or stored by the processor 210. The memory 204 may be a type of non-transitory computer-readable medium capable of storing information accessible by the processor 210, such as a hard drive, solid state drive, tape drive, optical storage, memory card, ROM, RAM, DVD, CD-ROM, write-capable, and read-only memories. The processor 210 can be a well-known processor or other lesser-known types of processors. Alternatively, the processor 210 can be a dedicated controller such as an ASIC.

The instructions 208 can be a set of instructions executed directly, such as machine code, or indirectly, such as scripts, by the processor 210. In this regard, the terms "instructions," "steps." and "programs" can be used interchangeably herein. The instructions 208 can be stored in object code format for direct processing by the processor 210, or other types of computer language including scripts or collections of independent source code modules that are interpreted on demand or compiled in advance. For example, instructions 208 may include instructions for fan 104 depicted in FIG. 1 to change speed, start or stop operating based upon input from the power consumption monitoring module 212, as previously described herein.

The data 206 can be retrieved, stored, or modified by the processor 210 in accordance with the instructions 208. For instance, although the system and method are not limited by a particular data structure, the data 206 can be stored in computer registers, in a relational database as a table having a plurality of different fields and records, or in XML documents. The data 206 can also be formatted in a computer-readable format such as, but not limited to, binary values, ASCII, or Unicode. Moreover, the data 206 can include information sufficient to identify relevant information, such as numbers, descriptive text, proprietary codes, pointers, references to data stored in other memories including other network locations, or information that is used by a function to calculate relevant data. Data 206 can include historic data pertaining to the correlation between certain temperatures and the required fan speed to cool the temperature of the data center. Additionally or alternatively, data 206 may include test data obtained based on experiments performed using fan 104.

The power consumption monitoring module 212 may receive power consumed by one or more computing devices. Based on individual power consumed by the computing devices, and/or aggregate power of multiple computing devices within a system, the power consumption monitoring module 212 in conjunction with the processor(s) 210 executing instructions 208, determine a minimum fan speed for the cooling fans. The determination may further be based on operational characteristics of the computing devices. Information related to such operational characteristics may be stored as data 206.

Optionally, the system 202 may further include a temperature monitoring module 214. For example, the temperature monitoring module may receive temperature measurements, such as measured exhaust temperature, from one or more sensors. Such measurements may be used, for example, as a verification that the minimum fan speed activated by the power consumption monitoring module 212 is effective. However, the temperature monitoring module 214 is not needed for effective cooling by the fans, and therefore reliable cooling may be achieved by the system 202 even when temperature sensors are unavailable.

FIG. 2 functionally illustrates the processor 210 and memory 204 as being within the same block, but the processor 210 and memory 203 may instead include multiple processors and memories that may or may not be stored within the same physical housing. For example, some of the instructions 208 and data 206 may be stored on a removable CD-ROM and others may be within a read-only computer chip. Some or all of the instructions and data can be stored in a location physically remote from, yet still accessible by, the processor 210. Similarly, the processor 210 can include a collection of processors, which may or may not operate in parallel.

It is to be appreciated that in this example, the power consumption monitoring module 212 is shown as part of temperature control system 202. In other examples, the power consumption monitoring module 212 may be implemented in one or more other systems or computing devices.

FIG. 3 is an example flow diagram for thermal control process 300 based on power consumption. Although the operations are described in a particular order, it should be understood that the order may be modified or operations may be performed simultaneously. Moreover, operations may be added or omitted.

According to block 302, operational characteristics of computing devices to be monitored are determined. The operational characteristics may include, for example, a correlation of power consumption and exhaust temperature. The correlation may be determined by numerous varied tests. Examples include system characterization tests for determining power to exhaust temperature correlation. A system fan test may use a flow chamber or wind tunnel, and provide data to correlate the system fan speed to the system air flow rate. This may also apply to liquid cooling, where a flow meter can be used to measure flow rate, to correlate with valve opening or pump speed. Accordingly:

Flow Rate=k*Fan speed, where k is a coefficient found from the test data

Inlet and exhaust fluid temperature measurements may use temperature sensors, such as thermocouples, thermistors, etc., and such measurements may be correlated with power measured by voltage and/or current. In such example, the fan speed may be calculated as:

$$\text{Fan Speed} = \text{Power} / (k * \text{Heat Capacity} * (\text{Temp\_outlet} - \text{Temp\_inlet}))$$

Gain of the open-loop controller, where power is input and fan speed it output for a target outlet temperature control, may be found using:

$$\text{Gain} = 1 / (k * \text{Heat Capacity} * (\text{Temp\_outlet} - \text{Temp\_inlet}))$$

Other examples include system characterization of power for device temperature control. Such characterization may include device internal temperature sensor reading or external attached sensor readings, device power consumption changes, and fan speed characterization to determine the minimum fan speed required to prevent the device from overheating at a power number. From these characterizations, the minimum required fan speed as a function of device power can be determined.

According to block 304, the thermal control system may monitor the power consumption level of one or more computing devices. According to some examples, there are multiple server racks equipped in a data center and each server rack may include multiple servers comprising multiple computing devices. Each computing device may consume a different amount of power. The thermal control system may monitor each computing device's power consumption level and compute the average power consumption. According to other examples, the thermal control system may monitor power consumption by a representative subset of or more of the computing devices, and use the power measured from the subset to apply cooling to a broader set of computing devices.

Figure 4:
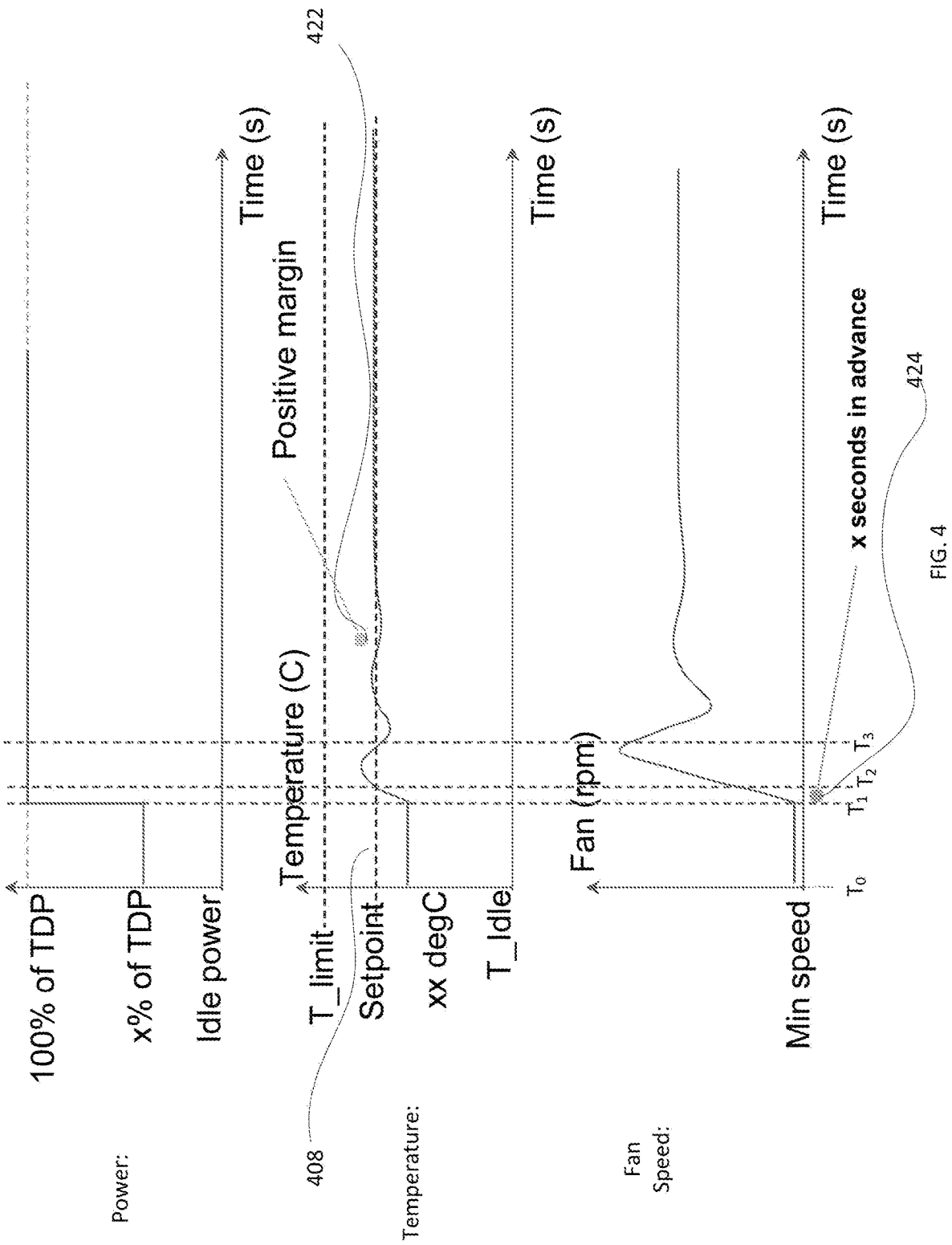
FIG. 4 provides graphs representing step response to the power level of a server, temperature of the components in the server, and fan speed, in accordance with aspects of the disclosure.

According to block 306, a minimum fan speed for one or more cooling fans may be determined based on the monitored power consumption and the operational characteristics. The minimum cooling speed may be determined using historical data and/or test data. For example, based on a correlation of power consumption with temperature, as shown in FIG. 4, a minimum fan speed needed to keep the exhaust temperatures within a particular range or under a specified threshold may be determined. According to some examples, such determination may employ a machine learning algorithm. The machine learning algorithm may be trained using historic and/or test data related to power consumption and exhaust temperatures to determine the minimum fan speed. In some examples, the machine learning algorithm may be continually updated using execution results. The determination may be performed using an open-loop system. For example, readings from external temperature sensors is not needed to be measured and input for determination of whether a desired temperature has been reached or whether further cooling should be performed.

According to block 308, in response to the detected change in power consumption, the cooling fans may be activated at the determined fan speed. Each fan may be connected to one or more fan controllers and each fan may be connected to a corresponding server or server rack. Based on the monitored exhaust temperature and the power consumption level of individual computing devices or entire server racks as a whole, the fan may be either individually controlled or monitored in aggregate. If the speeds of the fans are controlled and monitored in the aggregate, the power resources used to control the temperature of the data center may be drastically saved.

FIG. 4 illustrates vertically aligned graphs representing relationships between changes in power level over time and corresponding changes in temperature and fan speed. The power, temperature, and fan speed graphs are vertically aligned such that the x-axis, representing time, for each graph is aligned. In this regard, changes in power, temperature, and fan speed can be correlated over time. Between time $T_0$ and $T_1$, the computing device operates at x % power and temperature is below setpoint 408, which may represent a threshold exhaust air temperature. At time T1, there is a spike in power as it rises to 100% of TDP (Thermal Design Power). The temperature, however, does not cross the setpoint until time T2. In conventional systems, the fans would not be triggered until the temperature crossed the setpoint at time T2. However, the present cooling system will trigger the fan proactively at time T1 in response to the change in power. In this regard, the fan begins cooling several seconds earlier than it otherwise would have, and can therefore proactively keep the exhaust temperature at an acceptable level rather than waiting for a threshold to be crossed.

Figure 5:
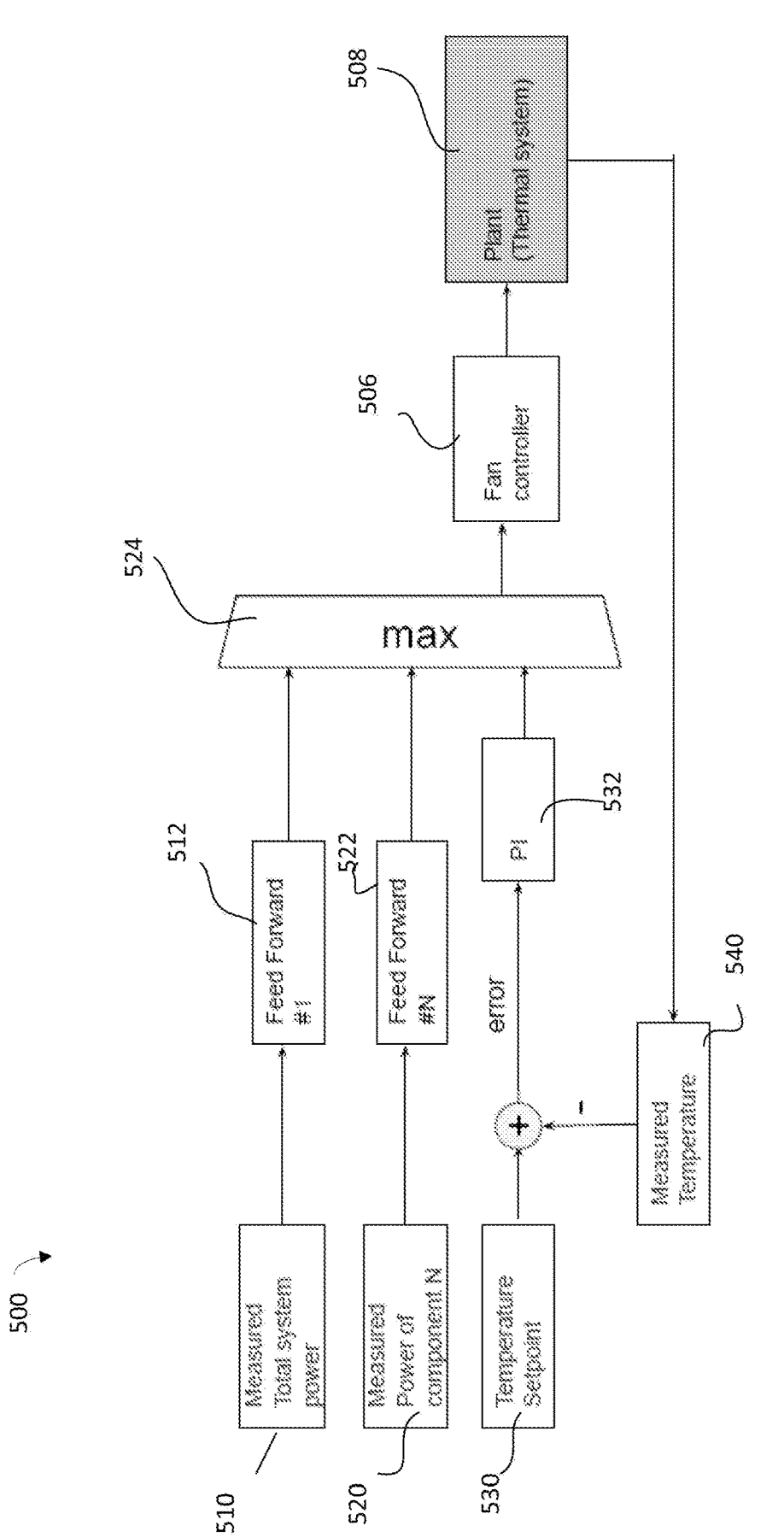
FIG. 5 illustrates an example implementation of the power consumption of each server as input for thermal control in accordance with aspects of the disclosure.

FIG. 5 illustrates an example implementation of a thermal control system 500 utilizing power consumption as input for thermal control. The thermal control system 500 may include fan controller 506, which may control thermal system 508 of a plant. The thermal system 508 may include one or more fans or other cooling devices. In this regard, the thermal control system 500 may also be utilized to cool components in a server rack and/or the entire server rack. Some or all of the components may be connected to one or more sensors, such as power measurement devices, etc.

In some examples, power of the total system as well as power of one or more individual components may be measured. The measured total system power 510 may be provided to a feed forward controller 512. Similarly, measured power of component N 520 may be provided to feed forward controller 522 for the individual component. Each feed forward controller 512, 522 may be an open-loop control based on power consumption. In some examples, gain and offset may be used for the feed forward control, so that output fan speed is proportional to the power consumption or heat generation. In other examples, known information from the plant (server thermal system) may be used for the feed forward control. While one power measurement and feed forward mechanism is shown for an individual component, any number of individual measurements may be supplied as inputs.

A maximum output from the feed forward controllers 512, 522 may be selected. For example, where the output from each feed forward controller 512, 522 is a fan speed, the maximum fan speed may be selected as set as the setpoint for the fan controller. In this regard, the fan always provides enough air flow to the controller that asks for the highest amount of airflow.

The thermal control system 500 may also include some conventional thermal control components. For example, the open-loop control system based on monitored power consumption may be built on top of conventional systems having closed loop temperature monitoring components. As shown, the system may include proportional integral derivative controller (PID) 532. PID 532 may receive a temperature setpoint 530.

Measured temperature 540 may be fed back as input in a feedback loop to the PID 532. For example, measured temperature 540 may be measured by thermal sensors measuring the current temperature of one or more servers.

Controller 524 may receive thermal margin information from the measured power inputs and temperature setpoint and determine a minimum fan speed, instructing the fan controller 506 accordingly. For example, controller 524 may monitor the setpoint of the allowable temperature set for server rack and monitor the fan speed change and temperature change of each server within the server rack. Once controller 524 determines whether the combined information of the temperature and power consumption level reaches a certain point, controller 524 may instruct fan controller 506 to change the speed of one or more fans.

Figure 6:
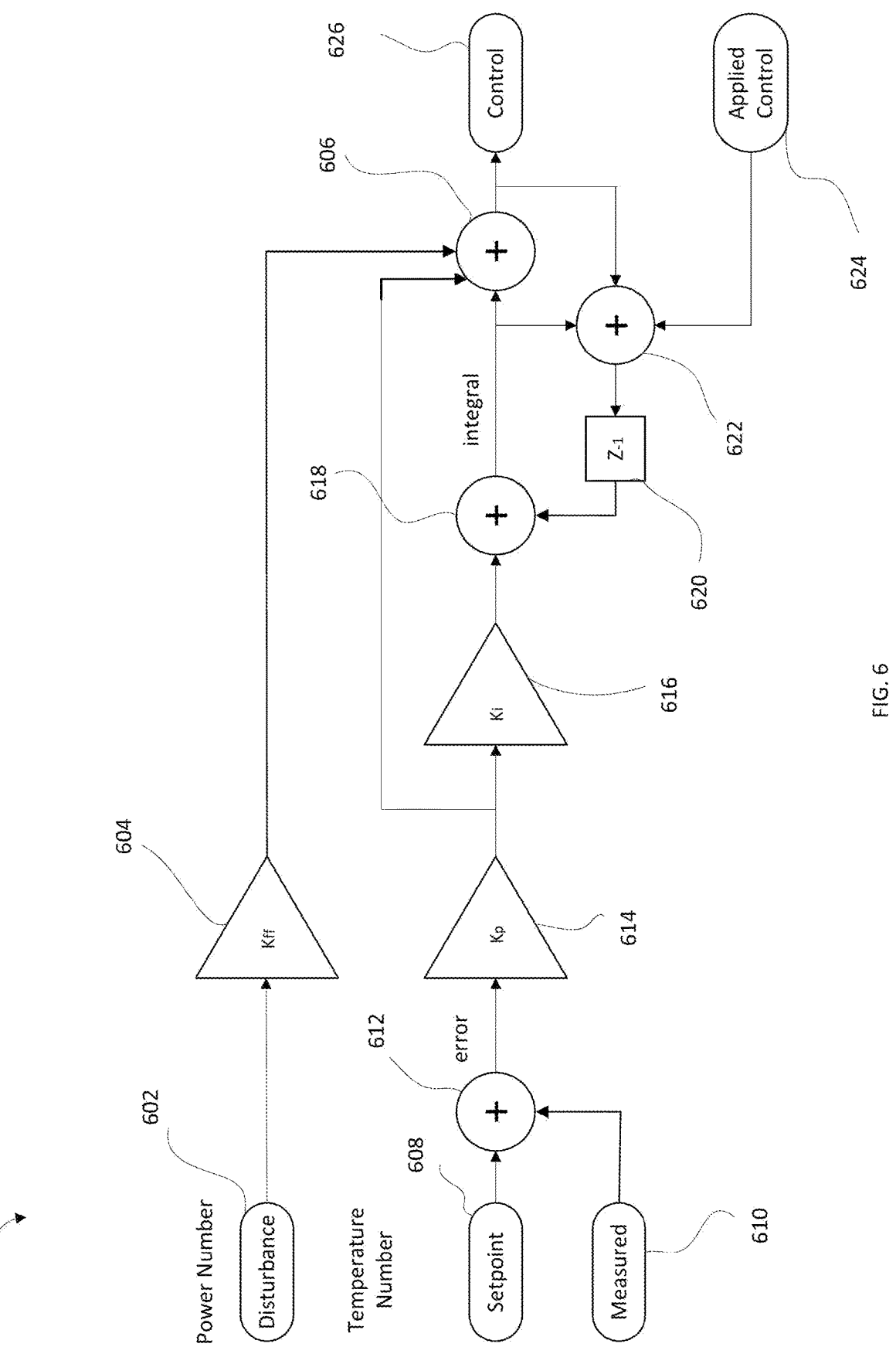
FIG. 6 illustrates an example implementation of the thermal control system in accordance with aspects of the disclosure.

FIG. 6 illustrates an example implementation of the thermal control system 600. In this implementation, disturbance may be input to the thermal control system 600, wherein disturbance represents a power fluctuation that will deviate temperature from the setpoint. Thermal system 600 may receive disturbance information 602. Disturbance information 602 may represent a deviation or any change in the power consumption level of computing device(s) used for the server(s). Disturbance information 602 may be sent to amplifier 604. Amplifier 604 may send the amplified signal to integration controller 606. The thermal control system 600 may also receive temperature setpoint information 608 and measured temperature information 610. The measured temperature information 610 may include the delta temperature of the inlet and outlet temperature of each server. Temperature setpoint information 608 and measure temperature information 610 may be integrated at integration controller 612. Integration controller 612 may also detect errors that may have occurred in the measured temperature information 610 while being measured. The integration controller 612 may send the received signal to amplifier 614. Amplifier 614 may send the amplified signal directly to integration controller 606 or another amplifier 616. A data center operator may manually input applied control 624. Applied control 624 may be sent to integration controller 622. The integrated signal may be sent to delay $Z^{-1}$ 620 and the delayed signal may be sent to integration controller 618. The integrated signal may be sent to integration controller 606 and the integrated signal may be sent to control 626 to control the speed of the fan(s) to reduce the temperature of the data center.

The thermal cooling system described herein is beneficial at least in that it provides for efficiently cooling a datacenter or other environment in which computing devices operate with fluctuations in power consumption. By triggering the cooling fans based on power consumption, rather than temperature, the cooling process begins prior to temperatures reaching higher levels. In this regard, the fans consume less power, as they can operate at lower speeds to maintain the cooler environment, rather than operating at higher speeds to more aggressively achieve cooling after higher temperatures have already been reached. Moreover, the operating environment is safer, as the thermal cooling system described herein reduces a possibility of computing devices overheating or failing from reaching high temperatures.

In this specification, the phrase "configured to" is used in different contexts related to computer systems, hardware, or part of a computer program, engine, or module. When a system is said to be configured to perform one or more operations, this means that the system has appropriate software, firmware, and/or hardware installed on the system that, when in operation, causes the system to perform the one or more operations. When some hardware is said to be configured to perform one or more operations, this means that the hardware includes one or more circuits that, when in operation, receive input and generate output according to the input and corresponding to the one or more operations. When a computer program, engine, or module is said to be configured to perform one or more operations, this means that the computer program includes one or more program instructions, that when executed by one or more computers, causes the one or more computers to perform the one or more operations.

Although the technology herein has been described with reference to particular examples, it is to be understood that these examples are merely illustrative of the principles and applications of the present technology. It is therefore to be understood that numerous modifications may be made and that other arrangements may be devised without departing from the spirit and scope of the present technology as defined by the appended claims.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A thermal control system for thermal control of a server system, the thermal control system comprising:
  memory; and
  one or more processors in communication with the memory and configured to:
    identify operational characteristics of a plurality of computing devices;
    monitor a power consumption level of the plurality of computing devices;

10 determine, in an open-loop system based on the monitored power consumption level and the operational characteristics, a minimum fan speed for one or more cooling fans, wherein the minimum fan speed is determined from a system characterization established by test data that correlates discrete power consumption levels with minimum required fan speeds to maintain a target temperature; and
    activate, in response to detection of a change in the power consumption level, the one or more cooling fans at the minimum fan speed.

2. The thermal control system of claim 1, wherein the power consumption level is measured for an aggregate of the plurality of computing devices.

3. The thermal control system of claim 2, wherein the speed of each of the one or more cooling fans is controlled uniformly based on the power consumption level measured for the aggregate of the plurality of computing devices.

4. The thermal control system of claim 1, wherein the change in power consumption level is compared to a threshold determined using the test data.

5. The thermal control system of claim 1, wherein the speed of the one or more cooling fans is configured to change in advance when the monitored power consumption level changes, while exhaust temperature does not exceed a preconfigured temperature limit.

6. A method for thermal control of a server system, the method comprising:
  identifying operational characteristics of a plurality of computing devices;
  monitoring, with one or more processors, a power consumption level of the plurality of computing devices;
  determining, based on the monitored power consumption level and the operational characteristics for the plurality of computing devices, a minimum fan speed for one or more cooling fans, wherein the minimum fan speed is determined from a system characterization established by test data that correlates discrete power consumption levels with minimum required fan speeds to maintain a target temperature; and
  in response to detection of a change in the monitored power consumption level, activating the one or more cooling fans at the minimum fan speed.

7. The method of claim 6, wherein the power consumption level is measured for an aggregate of the plurality of computing devices.

8. The method of claim 7, wherein the speed of each of the one or more fans is controlled uniformly based on the power consumption level measured for the aggregate of the plurality of computing devices.

9. The method of claim 7, wherein the change in power consumption level is compared to a threshold determined using the test data.

10. The method of claim 7, wherein the speed of the one or more cooling fans is configured to change in advance when the monitored power consumption level exceeds a preconfigured power threshold, while exhaust temperature does not exceed a limit.

11. A non-transitory machine-readable medium comprising machine-readable instructions encoded thereon for performing a method of thermal control of a data center, the method comprising:
  identifying operational characteristics of a plurality of computing devices;
  monitoring a power consumption level of a plurality of computing devices;

determining, in an open-loop system based on the monitored power consumption level and operational characteristics for the plurality of computing devices, a minimum fan speed for one or more cooling fans, wherein the minimum fan speed is determined from a system characterization established by test data that correlates discrete power consumption levels with minimum required fan speeds to maintain a target temperature; and activating, in response to detection of a change in the power consumption level, the one or more cooling fans at the minimum fan speed.

12. The non-transitory machine-readable medium of claim 11, wherein the power consumption level is measured for an aggregate of the plurality of computing devices.

13. The non-transitory machine-readable medium of claim 12, wherein the speed of each of the one or more cooling fans is controlled uniformly based on the power consumption level measured for the aggregate of the plurality of computing devices.

14. The non-transitory machine-readable medium of claim 11, wherein the change in power consumption level is compared to a threshold determined using the test data.

* * * * *